(12) United States Patent
Tilton et al.

(10) Patent No.: US 6,976,528 B1
(45) Date of Patent: Dec. 20, 2005

(54) SPRAY COOLING SYSTEM FOR EXTREME ENVIRONMENTS

(75) Inventors: Charles L. Tilton, Clarkston, WA (US); Douglas W. Miller, Moscow, ID (US); William C. Gustafson, Moscow, ID (US); William J. Beasley, Moscow, ID (US); Chester L. Turner, Clarkston, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 338 days.

(21) Appl. No.: 10/369,321

(22) Filed: Feb. 18, 2003

(51) Int. Cl.$^7$ .............................................. F28D 15/00
(52) U.S. Cl. ................................. 165/104.33; 165/266
(58) Field of Search .......................... 165/104, 33, 298, 165/266; 361/699; 62/259.2

(56) References Cited

U.S. PATENT DOCUMENTS

| | | | | |
|---|---|---|---|---|
| 3,213,929 | A | * 10/1965 | Marshall | ...................... 165/298 |
| 3,406,244 | A | 10/1968 | Oktay | .......................... 174/15 |
| 3,774,661 | A | 11/1973 | Duong | ........................ 144/326 |
| 4,399,484 | A | 8/1983 | Mayer | ........................ 361/382 |
| 4,897,762 | A | 1/1990 | Daikoku et al. | ............. 361/382 |
| 4,912,600 | A | 3/1990 | Jaeger et al. | ................ 361/385 |
| 4,967,829 | A | 11/1990 | Albers et al. | ................... 165/1 |
| 5,021,924 | A | 6/1991 | Kieda et al. | ................. 361/385 |
| 5,220,804 | A | 6/1993 | Tilton et al. | ..................... 62/64 |
| 5,293,754 | A | 3/1994 | Mizuno | ........................ 62/185 |
| 5,311,931 | A | 5/1994 | Lee | .......................... 165/109.1 |
| 5,349,831 | A | 9/1994 | Daikoku et al. | ............... 62/376 |
| 5,515,910 | A | 5/1996 | Hamilton et al. | .............. 165/30 |
| 5,522,452 | A | * 6/1996 | Mizuno et al. | ......... 165/104.33 |
| 5,579,826 | A | * 12/1996 | Hamilton et al. | ...... 165/104.33 |
| 5,675,473 | A | 10/1997 | McDunn et al. | ............. 361/699 |
| 5,687,577 | A | 11/1997 | Ballard et al. | .................. 62/64 |
| 5,718,117 | A | 2/1998 | McDunn et al. | ................ 62/64 |
| 5,719,444 | A | 2/1998 | Tilton et al. | ................. 257/714 |
| 5,746,585 | A | 5/1998 | McDunn et al. | ........ 417/477.11 |
| 5,761,035 | A | 6/1998 | Beise | .......................... 361/699 |
| 5,768,103 | A | 6/1998 | Kobrinetz et al. | ........... 361/699 |
| 5,818,692 | A | 10/1998 | Denney, Jr. et al. | ......... 361/699 |
| 5,831,824 | A | 11/1998 | McDunn et al. | ............. 361/699 |
| 5,841,564 | A | 11/1998 | McDunn et al. | ............. 359/161 |
| 5,860,602 | A | 1/1999 | Tilton et al. | ................. 239/548 |
| 5,879,503 | A | 3/1999 | McDunn et al. | .......... 156/304.2 |
| 5,880,931 | A | 3/1999 | Tilton et al. | ................. 361/690 |

(Continued)

FOREIGN PATENT DOCUMENTS

EP 0091733 10/1982

(Continued)

OTHER PUBLICATIONS

Spray Cooling, Tilton, Donald E., PhD Dissertation, University of Kentucky, 1989.

(Continued)

*Primary Examiner*—Teresa J. Walberg
(74) *Attorney, Agent, or Firm*—Michael S. Neustel (57) ABSTRACT

A spray cooling system for extreme environments for providing a desired enclosed environment for electronic devices regardless of external environmental conditions. The spray cooling system for extreme environments includes an enclosure that isolates the electronic components from the external environment, a spray unit within the enclosure for thermally managing one or more electronic devices, a pump unit fluidly connected to the spray unit, a heat exchanger unit fluidly connected to the pump, and a control valve fluidly connected between the heat exchanger unit and the pump. An independent chamber preferably houses a heater unit, a first power supply and a control unit, whereby the heater unit initially heats the coolant within the independent chamber to a minimum operating temperature prior to operation of the electronic components.

27 Claims, 6 Drawing Sheets

U.S. PATENT DOCUMENTS

| | | | |
|---|---|---|---|
| 5,907,473 A | 5/1999 | Przilas et al. | 361/699 |
| 5,924,482 A | 7/1999 | Edwards et al. | 165/104.33 |
| 5,933,700 A | 8/1999 | Tilton | 419/6 |
| 5,937,937 A | 8/1999 | Sehmbey et al. | 165/104.33 |
| 5,943,211 A | 8/1999 | Havey et al. | 361/699 |
| 6,014,238 A | 1/2000 | McDunn et al. | 359/161 |
| 6,016,969 A | 1/2000 | Tilton et al. | 239/1 |
| 6,061,966 A | 5/2000 | Nelson et al. | 333/202 |
| 6,108,201 A | 8/2000 | Tilton et al. | 361/689 |
| 6,115,251 A | 9/2000 | Patel et al. | 361/699 |
| 6,129,361 A | 10/2000 | Dover | 277/602 |
| 6,134,108 A | 10/2000 | Patel et al. | 361/695 |
| 6,139,361 A * | 10/2000 | Przilas et al. | 439/559 |
| 6,205,799 B1 | 3/2001 | Patel et al. | 62/132 |
| 6,292,364 B1 | 9/2001 | Fitzgerald et al. | 361/699 |
| 6,330,152 B1 | 12/2001 | Vos et al. | 361/688 |
| 6,349,554 B2 | 2/2002 | Patel et al. | 62/259.2 |
| 6,377,453 B1 | 4/2002 | Belady | 361/687 |
| 6,377,458 B1 | 4/2002 | Morris et al. | 361/699 |
| 6,414,619 B1 | 7/2002 | Swanson | 341/155 |
| 6,447,270 B1 | 9/2002 | Schmidt et al. | 417/366 |
| 6,457,321 B1 | 10/2002 | Patel et al. | 62/259.2 |
| 6,484,521 B2 | 11/2002 | Patel et al. | 62/171 |
| 6,498,725 B2 | 12/2002 | Cole et al. | 361/700 |
| 6,571,569 B1 | 6/2003 | Rini et al. | 62/259.2 |
| 6,651,761 B1 * | 11/2003 | Hrovat et al. | 165/41 |
| 6,679,081 B2 | 1/2004 | Marsala | 62/259.2 |
| 2001/0002541 A1 | 6/2001 | Patel et al. | 62/259.2 |
| 2002/0050144 A1 | 5/2002 | Patel et al. | 62/259.2 |
| 2002/0075650 A1 | 6/2002 | Morris et al. | 361/699 |
| 2002/0112491 A1 | 8/2002 | Malone et al. | 62/171 |
| 2002/0112496 A1 | 8/2002 | Bash et al. | 62/259.2 |
| 2002/0112498 A1 | 8/2002 | Bash et al. | 62/259.2 |
| 2002/0113141 A1 | 8/2002 | Malone et al. | 239/124 |
| 2002/0113142 A1 | 8/2002 | Patel et al. | 239/128 |
| 2002/0114139 A1 | 8/2002 | Bash et al. | 361/719 |
| 2002/0114140 A1 | 8/2002 | Bash et al. | 361/719 |
| 2002/0135981 A1 | 9/2002 | Pautsch | 361/700 |
| 2003/0039872 A1 * | 2/2003 | Grasso et al. | 429/24 |

FOREIGN PATENT DOCUMENTS

| EP | 0480750 | 4/1992 |
|---|---|---|
| WO | WO 01/01741 | 1/2001 |

OTHER PUBLICATIONS

High-Flux Spray Cooling in a Simulated Multichip Module, Tilton, Donald E. et al., ASME 1992 National Heat Transfer Conference, San Diego, CA, 1992.

Spray Cooling at Low System Pressure, Marcos, A., et al., 18th IEEE Semi-Therm Symposium, 2002.

High-Performance COTS DSP for Harsh Environment VME Electronics, Tilton, Donald E. et al., COTS Journal, May/Jun. 1999.

Mist Cooling for Harsh Environment VME, Tilton, Donald E. et al., RTC Magazine, May 1999.

Advanced Thermal Management for Multichip Modules, Tilton, Donald E. et al., Electronic Packaging & Production, Aug. 1995.

Advanced Thermal Management for High Density Distributed Power Systems, Smetana, Bruce A. et al., HFPC Conference, May 1995.

Spray Cooling for the 3-D Cube Computer, Tilton, Donald E. et al., InterSociety Conference on Thermal Phenomena in Electronic Systems, 1-THERM IV, Washington D.C., May 1994.

Liquid Nitrogen Spray Cooling of a Simulated Electronic Chip, Tilton, Donald E. et al., Proceedings of the 1993 Cryogenic Engineering Conference, Albuquerque, New Mexico, Jul. 1993.

Spray Cooling of Simulated Electronic Chips in a Compact Package, Tilton, Donald E. et al., Final Report, Air Force Contract F33615-89-C-2972, Oct. 1991.

Critical Heat Flux Penomena in Spray Cooling, Tilton, Donald E. et al., AIAA Paper 90-1729, AIAA/ASME 5th Joint Thermophysics and Heat Transfer Conf., Seattle, WA, Jun. 1990.

Closed-System High-Flux Evaporative Spray Coolling, Tilton, Donald E. et al., SAE Paper 892316 Aerotech 89 Anneheim, CA.

High-Heat-Flux, Low-Superheat Evaporative Spray Cooling, Pais, M.R. et al., AIAA Paper AIRR-89-0241, 27th Aerospace Sciences Meeting, Reno, Nevada, 1989.

Applying Mist to COTS Convection Modules Is Really Cool, Tilton, Charles, COTS View, 2000.

Advanced System Packaging for Embedded High Perfoirmance Computing, Sienski, Ken, et al.

SprayCool Enclosure Products, Isothermal Systems Research Website, www.spraycool.com.

Isothermal Systems Research—Way Cool Spray Cool, Isothermal Systems Research—David D. Tilton, www.navysbir.brtrc.com/SuccessStories/IsothermalSystems.pdf.

* cited by examiner

SPRAY COOLING SYSTEM FOR EXTREME ENVIRONMENTS

CROSS REFERENCE TO RELATED APPLICATIONS

Not applicable to this application.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. F33657-97-C-4505 awarded by the U.S. Air Force.

BACKGROUND OF THE INVENTION

1. Field of the Invention

The present invention relates generally to thermal management devices for electronic devices and more specifically it relates to a spray cooling system for extreme environments for providing an isolated environment for electronic devices regardless of external environmental conditions.

2. Description of the Related Art

Thermal management systems for electronic systems have been in use for years. In order to maintain maximum performance from electronic components, the components need to be maintained within a relatively narrow temperature band. Thermal management systems are utilized to maintain this desired narrow temperature band.

In environments where extreme temperatures are present (e.g. −65° C., +70° C., etc.), it is critical to provide a thermal management system that provides a desired internal operating environment to maintain peak efficiency, power and prevent system failure. In addition, some external environments include hostile elements such as but not limited to dust, sand, debris, salt, water, fog, condensed water vapor, contaminants and the like, which require the complete isolation of electronic components from the harsh external environment. Extreme external environments are encountered within various applications such as aircraft, ships, ground based applications and the like. It is absolutely crucial that electronic components be maintained in a safe internally controlled environment when in extreme external environments.

Conventional thermal management systems commonly utilized today are comprised of air-cooled enclosures (forced flow or free flow), conduction cooling and liquid immersion cooling. The main problem with air-cooled enclosures is that they introduce harmful external elements into the electronics enclosure. Another problem with air-cooled enclosures is that they do not provide a method to increase the temperature of electronic components to a desired operating temperature when the external temperature is extremely low (e.g. −65° C.).

Problems with conduction cooling systems include increased weight, increased size, increased mass, expensive, reduced shock and vibration tolerance, and reduced electronic component performance. A significant design limitation with conduction cooling systems is that they must be in direct contact with the electronic components which limits flexibility and increases expense. The large mass also increases the amount of time required to increase the temperature of electronic components to a desired operating temperature.

Spray cooling technologies are being adopted today as the most efficient option for thermally managing electronic systems in an enclosed internal environment. Spray cooling utilizes an atomized dielectric spray that is applied directly to the electronic device thereby forming a thin film on the electronic device. Spray cooling may be performed locally (i.e. where the chip is sprayed directly) or globally (i.e. where the chip and surrounding electronics/boards are also sprayed). U.S. Pat. No. 5,220,804 entitled High Heat Flux Evaporative Spray Cooling to Tilton et al. describes the earlier versions of spray cooling technology. U.S. Pat. No. 6,108,201 entitled Fluid Control Apparatus and Method for Spray Cooling to Tilton et al. also describes the usage of spray cooling technology to cool a printed circuit board.

While the conventional thermal management systems may be suitable for the particular purpose to which they address, they are not as suitable for providing an enclosed unit that maintains a desirable internal temperature over an extreme external temperature range. Conventional air-cooled technologies do not protect the electronic components from contamination by harmful elements. Conventional conduction cooling technologies are expensive and bulky.

In these respects, the spray cooling system for extreme environments according to the present invention substantially departs from the conventional concepts and designs of the prior art, and in so doing provides an apparatus primarily developed for the purpose of providing an enclosed unit that maintains a desirable internal temperature over an extreme external temperature range.

BRIEF SUMMARY OF THE INVENTION

In view of the foregoing disadvantages inherent in the known types of thermal management systems now present in the prior art, the present invention provides a new spray cooling system for extreme environments wherein the same can be utilized for providing a desired enclosed environment for electronic devices regardless of external environmental conditions.

The general purpose of the present invention, which will be described subsequently in greater detail, is to provide a new spray cooling system for extreme environments that has many of the advantages of the thermal management systems mentioned heretofore and many novel features that result in a new spray cooling system for extreme environments which is not anticipated, rendered obvious, suggested, or even implied by any of the prior art thermal management systems, either alone or in any combination thereof.

To attain this, the present invention generally comprises an enclosure that isolates the electronic components from the external environment, a spray unit within the enclosure for thermally managing one or more electronic devices, a pump unit fluidly connected to the spray unit, a heat exchanger unit fluidly connected to the pump, and a control valve fluidly connected between the heat exchanger unit and the pump. An independent chamber preferably houses a heater unit, a first power supply and a control unit, whereby the heater unit initially heats the coolant within the independent chamber to a minimum operating temperature prior to operation of the electronic components.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a spray cooling system for extreme environments that will overcome the shortcomings of the prior art devices.

A second object is to provide a spray cooling system for extreme environments for providing a desired enclosed environment for electronic devices regardless of external environmental conditions.

A further object is to provide a spray cooling system for extreme environments that may be utilized in various extreme environmental conditions including extreme external temperature conditions (e.g. −65° C., +70° C.).

Another object is to provide a spray cooling system for extreme environments that provides increased electronics performance regardless of external environmental conditions.

An additional object is to provide a spray cooling system for extreme environments that provides an improved system for heating the dielectric coolant.

Another object is to provide a spray cooling system for extreme environments that provides a desired operating temperature for electronic devices with no control over the cooling air passing through a heat exchanger unit.

A further object is to provide a spray cooling system for extreme environments that actively regulates the coolant flow through a heat exchanger unit.

A further object is to provide a spray cooling system for extreme environments that is relatively compact, inexpensive, shock resistant, vibration resistant, and lightweight.

Another object is to provide a spray cooling system for extreme environments that is able to increase the temperature of electronic devices to a desired temperature in a relative short period of time.

A further object is to provide a spray cooling system for extreme environments that isolates electronic devices from the external environment and external harmful elements.

Another object is to provide a spray cooling system for extreme environments that proportionally regulates the flow of coolant routed through an external heat exchanger.

A further object is to provide a spray cooling system for extreme environments that has an insulated enclosure that significantly limits heat transfer from the coolant within the enclosure to the external environment.

A further object is to provide a spray cooling system for extreme environments that maintains a constant internal operating temperature for electronic devices wherein no control is exercised over the cooling airflow through the heat exchanger (i.e. velocity, density, temperature).

Another object is to provide a spray cooling system for extreme environments that is suitable for use in airborne, ship and ground based environments.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Turning now descriptively to the drawings, in which similar reference characters denote similar elements throughout the several views, FIGS. 1 through 5 illustrate a spray cooling system for extreme environments 10, which comprises an enclosure 20 that isolates the electronic components from the external environment, a spray unit 30 within the enclosure 20 for thermally managing one or more electronic devices 12, a pump unit 52 fluidly connected to the spray unit 30, a heat exchanger unit 40 fluidly connected to the pump, and a control valve 42 fluidly connected between the heat exchanger unit 40 and the pump. An independent chamber 60 preferably houses a heater unit 62, a first power supply 64 and a control unit 66, whereby the heater unit 62 initially heats the coolant within the independent chamber 60 to a minimum operating temperature prior to operation of the electronic components. The present invention may be utilized in various extreme environmental conditions including extreme external temperature conditions (e.g. −65° C., +70° C.).

B. Enclosure

The enclosure 20 is comprised of a structure having at least one isolated internal compartment. The internal compartment is preferably insulated from the external environment to reduce the heat transfer from within the internal compartment to the external environment. The enclosure 20 may be comprised of various structures and configurations capable of isolating the internal compartment from the extreme elements and temperatures of the external environment.

C. Spray Unit

The spray unit 30 is positioned within the internal compartment of the enclosure 20. The spray unit 30 preferably has a separate enclosed structure for retaining and thermally managing the electronic devices 12. The spray unit 30 may have an integral card cage spray assembly or similar structure for retaining the electronic devices 12. More than one spray unit 30 may be utilized within the present invention.

The spray unit 30 may include one or more spray nozzles for applying atomized liquid coolant upon the electronic devices 12. The spray unit 30 may be comprised of various well-known spray cooling systems currently available for thermally managing electronic devices 12 with an atomized coolant.

D. Heat Exchanger Unit

Figure 1:
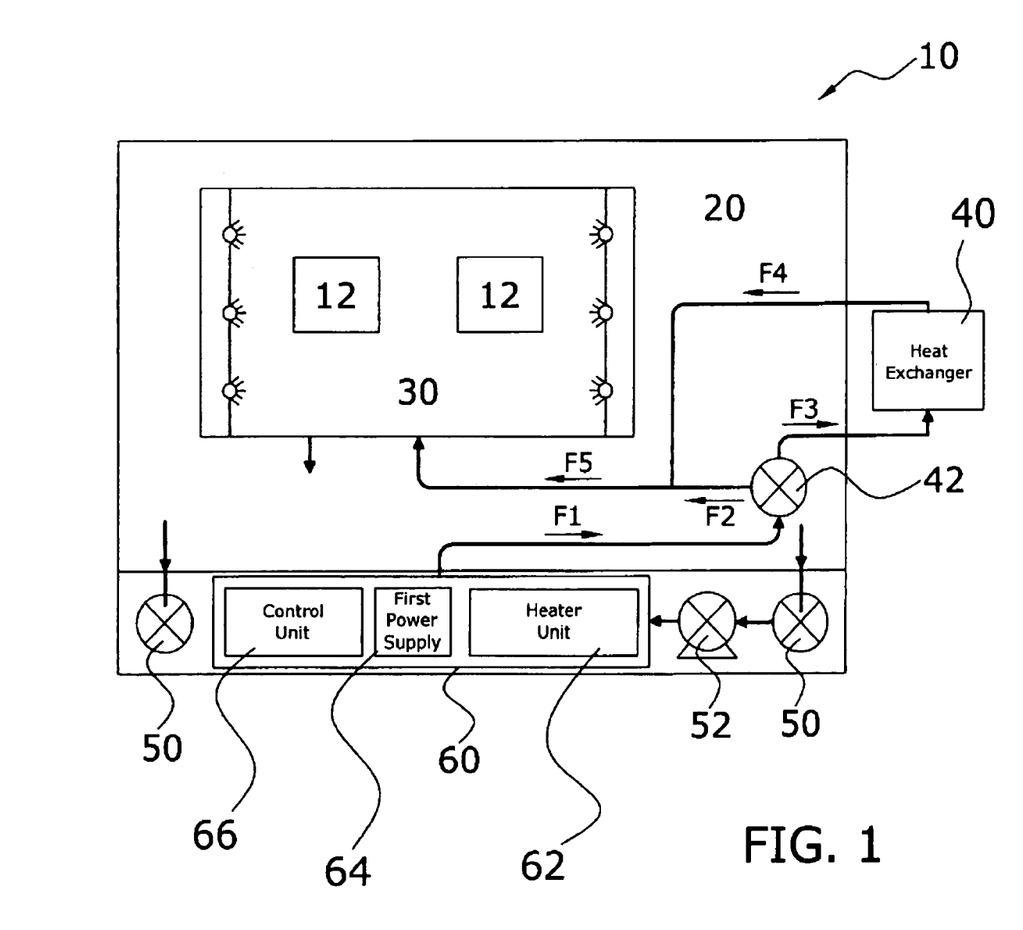
FIG. 1 is a schematic illustration of the present invention.

The heat exchanger unit 40 is fluidly connected to the spray unit 30 via coolant path F4 as shown in FIG. 1 of the drawings. The heat exchanger unit 40 is preferably positioned externally of the enclosure 20 in direct contact with the external environment where the air temperature, density and flow rate may vary greatly. The heat exchanger unit 40 may be comprised of various well-known structures commonly utilized within heat exchangers. More than one heat exchanger unit 40 may be utilized within the present invention.

E. Electronic Control System

Figure 2:
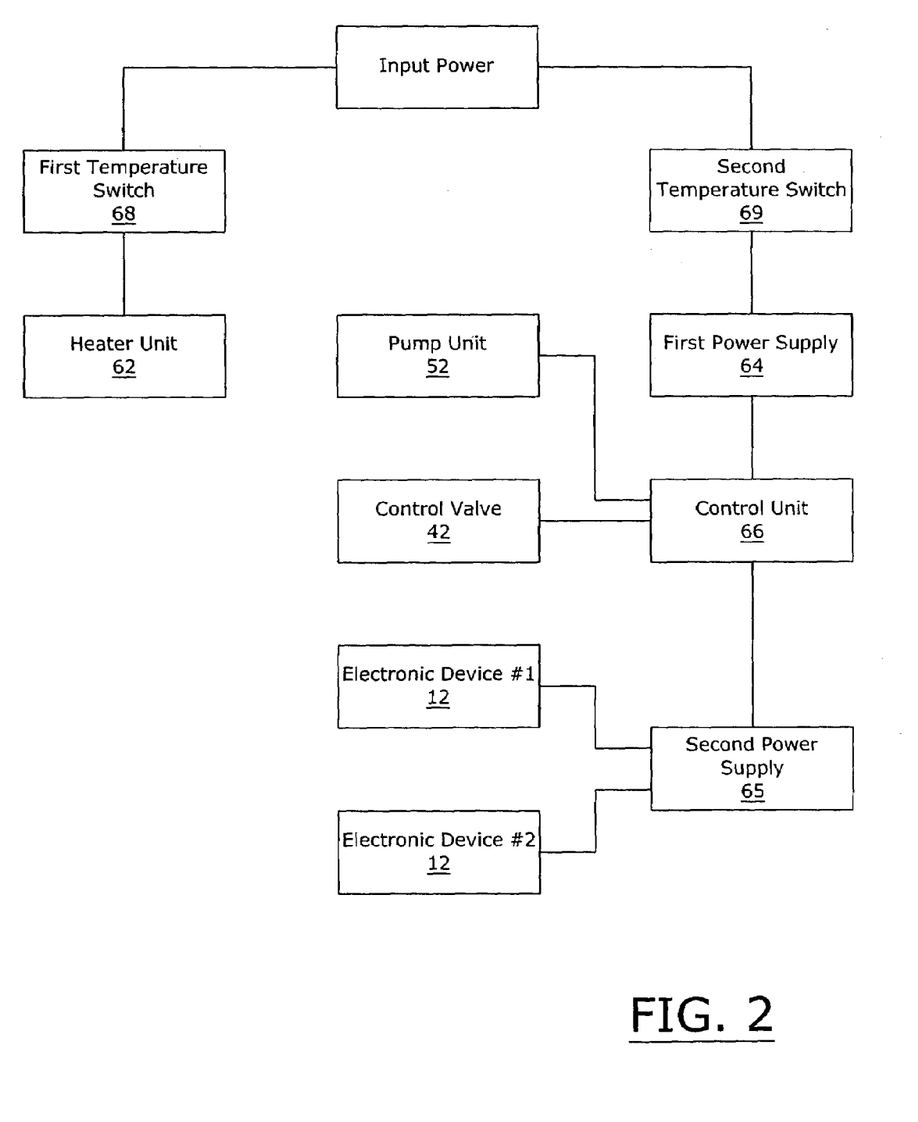
FIG. 2 is a block diagram of the electrical connections of the present invention.

FIG. 2 illustrates the electronic control system utilized within the present invention. More particularly, FIG. 2 illustrates a first temperature switch 68 and a second temperature switch 69 electrically connected to an input power. The input power may be comprised of a battery supply, generator or the vehicle's power supply. The input power may be comprised of alternating current (AC) or direct current (DC) operating at various voltage levels. A power filter may be electrically connected between the input power and the power supplies.

The temperature switch is electrically connected to and controls a heater unit 62 as further shown in FIG. 2 of the drawings. The first temperature switch 68 is normally within a closed state when the coolant temperature is below a minimum operating temperature 1 (hereinafter "MOT 1") thereby activating the heat unit to heat the coolant. The MOT 1 is a minimum operating temperature required to operate the first power supply 64, control unit 66, pump unit 52 and control valve 42. The MOT 1 may have various temperature set points and temperature ranges such as but not limited to −40° to −35° Celsius. The first temperature switch 68 preferably remains closed until the coolant temperature exceeds a minimum operating temperature 3 (hereinafter "MOT 3"). The MOT 3 may have various temperature set points and temperature ranges such as but not limited to −20° to −10° Celsius.

As shown in FIG. 2 of the drawings, the second temperature switch 69 is electrically connected to the first power supply 64 for providing electrical power to the first power supply 64 after the coolant temperature exceeds the MOT 1. The control unit 66 is in communication with the pump unit 52 and the control valve 42 for controlling the same.

The control unit 66 is further in communication with the second power supply 65, wherein the second power supply 65 is electrically connected to the electronic devices 12 within the spray unit 30 to be thermally managed as shown in FIG. 2 of the drawings. The second power supply 65 provides electrical power to the electronic devices 12 during normal operating conditions. The second power supply 65 may be located within the independent chamber 60 or within the spray unit 30. The control unit 66 activates the second power supply 65 and after the coolant temperature exceeds the minimum operating temperature 2 (hereinafter "MOT 2"). The MOT 2 is a temperature that is sufficient for the electronic devices 12 to operate. The MOT 2 may have various temperature set points and temperature ranges such as but not limited to −20° to −10° Celsius.

The control unit 66 may be comprised of various electronic devices 12 capable of communicating with and controlling the electronic devices 12, the spray unit 30, the heat exchanger unit 40, the pump unit 52, valves, the control valve 42 and other devices. The control unit 66 may be comprised of a computer or other electronic device capable of receiving and storing commands.

The control unit 66 may communicate with the external electrical devices such as but not limited to electrically or via communications signal. It can be appreciated that more than one control unit 66 may be utilized to control one or more of the components of the present invention.

F. Independent Chamber

As shown in FIG. 1 of the drawings, an independent chamber 60 is preferably positioned within the enclosure 20 for housing the heater unit 62, the first power supply 64 and the control unit 66. The independent chamber 60 is preferably fluidly connected to the pressurized side of the pump unit 52 for receiving the coolant during operation of the pump unit 52.

During the initial operation of the present invention, the heater unit 62 is first activated (without the pump unit 52 operating) to first heat the coolant within the independent chamber 60 thereby increasing the temperature of the first power supply 64 and the control unit 66 to a minimum operating temperature. The first power supply 64 is preferably positioned near the heater unit 62 thereby allowing the first power supply 64 to be heated initially as illustrated in FIG. 1 of the drawings.

G. Coolant Distribution System

The coolant distribution system of the present invention has two basic flow patterns. Each flow pattern begins with the one or more attitude independent valves 50 that are fluidly connected to the spray unit 30 for collecting the coolant. The attitude independent valves 50 may be positioned in various locations within the spray unit 30 for collecting a sufficient volume of liquid coolant during operation. Various other coolant collection devices may be utilized to collect the coolant from within the spray unit 30. The coolant distribution system of the present invention preferably does not utilize a reservoir, however it can be appreciated that a coolant reservoir may be utilized.

The attitude independent valves 50 are fluidly connected to the pump unit 52 as illustrated in FIG. 1 of the drawings. The pump unit 52 draws the liquid coolant and then dispenses the pressurized liquid coolant into the independent chamber 60. It can be appreciated that a portion of the pressurized coolant may be diverted around the independent chamber 60 instead of passing through the independent chamber 60.

The pump unit 52 forces the liquid coolant into the independent chamber 60 and then through flow path F1 as shown in FIG. 1 of the drawings. The pump unit 52 may be comprised of a conventional coolant pump and may be comprised of more than one pump. The independent chamber 60 is fluidly connected to the control valve 42 as further shown in FIG. 1 of the drawings. The control valve 42 controls the flow of the coolant through Path 1 (F1, F2, F5) or Path 2 (F1, F3, F4, F5) to the spray unit 30.

Path 1 (F1, F2, F5) provides a direct path for the coolant from the independent chamber 60 to the spray unit 30 without cooling through the heat exchanger unit 40 as shown in FIG. 1 of the drawings. Path 2 (F1, F3, F4, F5) diverts a portion of the coolant through the heat exchanger unit 40 to be cooled prior to the coolant entering the spray unit 30 as further shown in FIG. 1 of the drawings.

Figure 4:
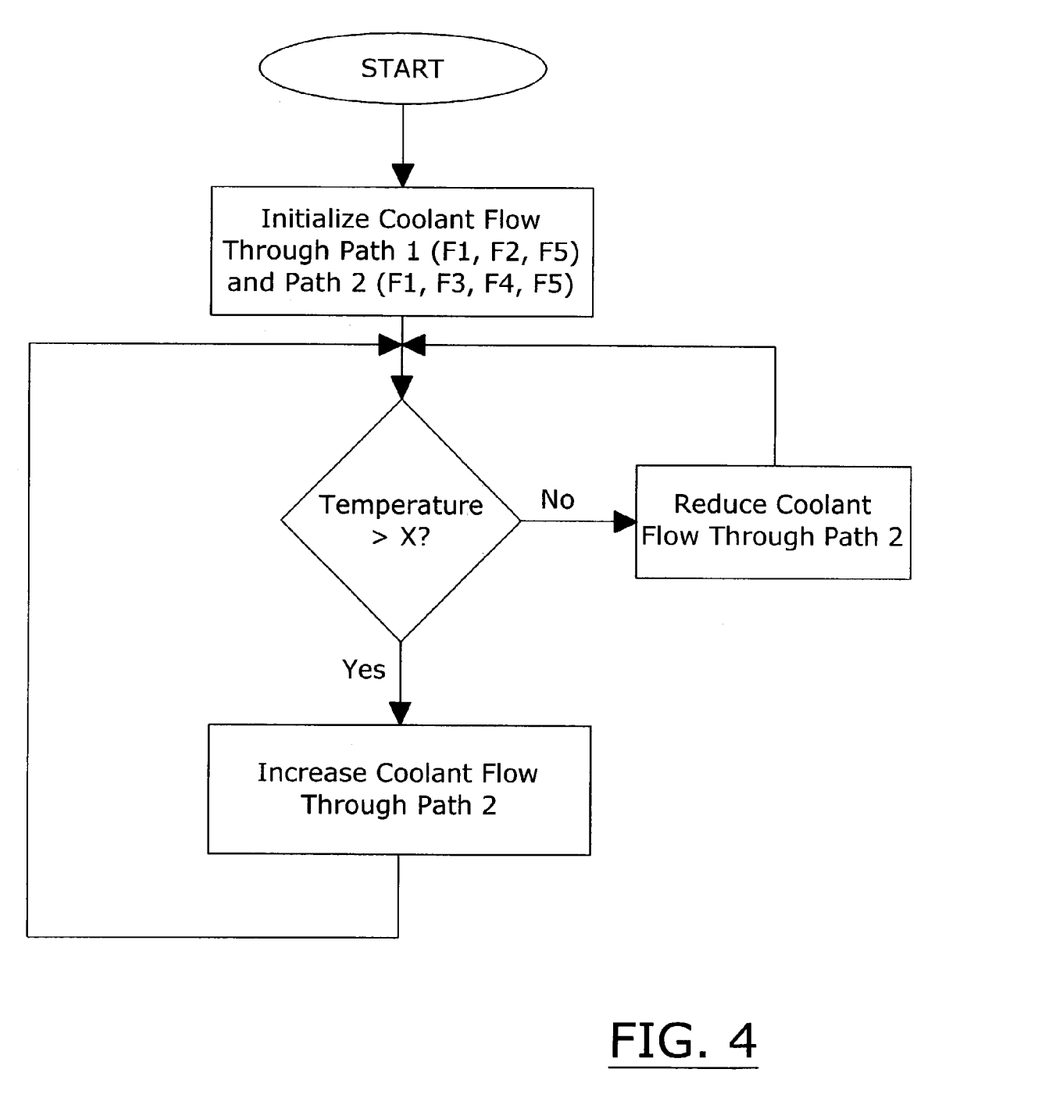
FIG. 4 is a flowchart illustrating the control of fluid flow through the present invention.

The control valve 42 controls the flow through Path 1 and Path 2 depending upon the temperature of the coolant. If the temperature of the coolant is less than temperature X, then the coolant flow is reduced through Path 2 and increased through Path 1 as shown in FIG. 4 of the drawings. The temperature X may have various temperature set points and temperature ranges such as but not limited to +40° to +50° Celsius. If the temperature of the coolant is greater than temperature X, then the coolant flow is increased through Path 2 and decreased through Path 1 as shown in FIG. 4 of the drawings.

H. Operation

Figure 3:
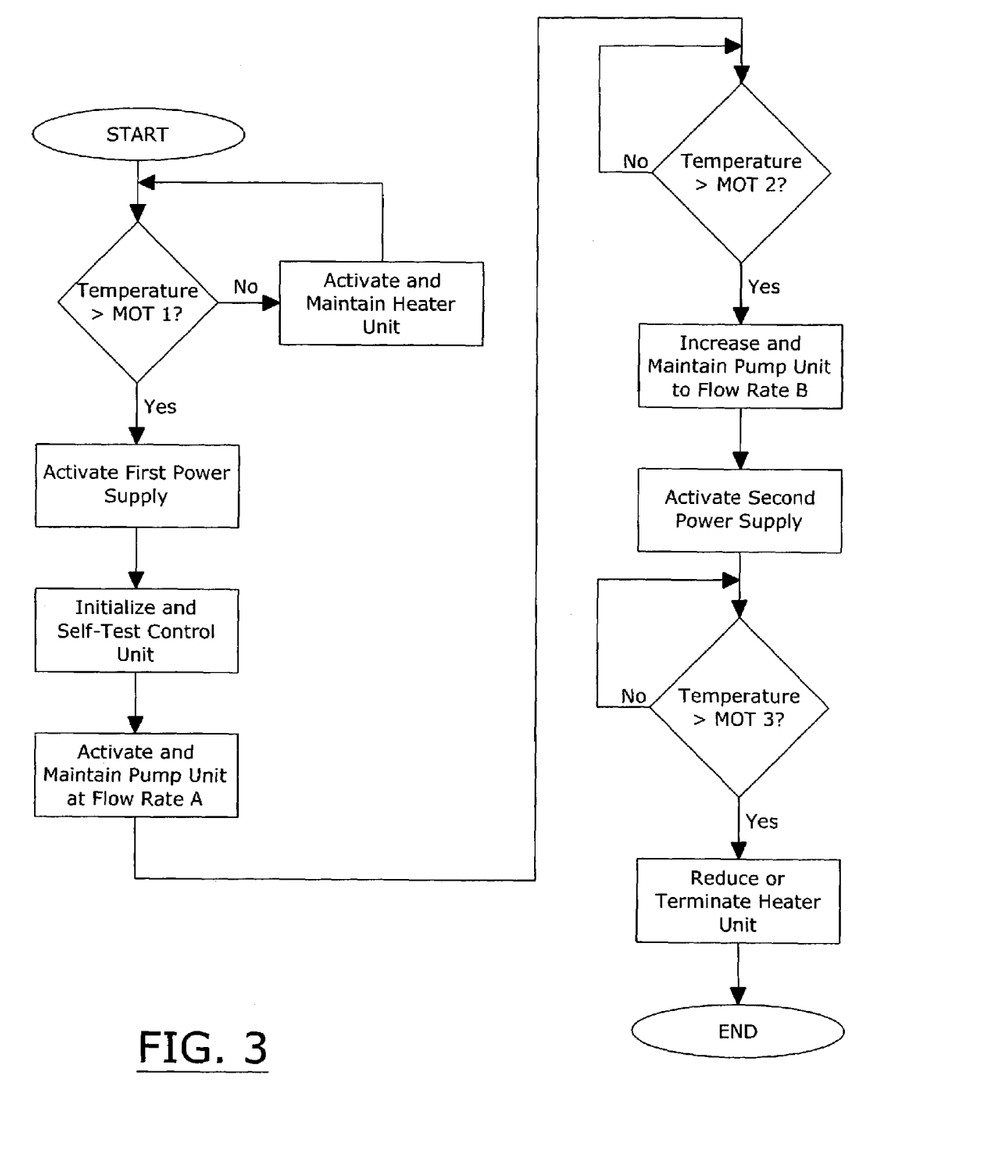
FIG. 3 is a flowchart illustrating the activation and operation of the present invention.

FIGS. 3 and 4 provide the overall operation of the present invention. If the initial coolant temperature is less than or equal to the MOT 1, then the first temperature switch 68 first activates the heater unit 62 prior to activating the pump unit 52 or other electrical components. The heater unit 62 heats the coolant within the independent chamber 60 as illustrated in FIG. 1 of the drawings. Since the first power supply 64 is preferably closest to the heater unit 62, the first power supply 64 is initially increased in temperature. The control unit 66 is also increased in temperature since the control unit 66 is also positioned within the independent chamber 60.

Figure 5:
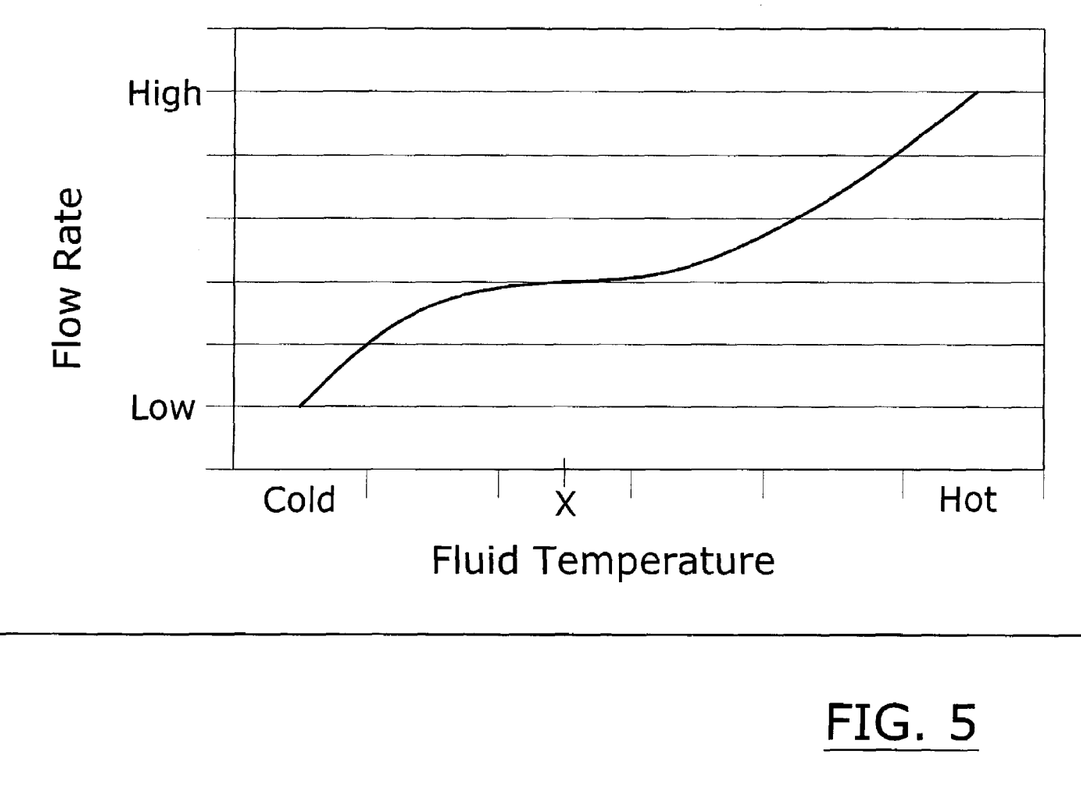
FIG. 5 is a chart illustrating the flow rate of the coolant based upon coolant temperature.

After the coolant temperature has increased to a level above the MOT 1, the first power supply 64 is activated by the second temperature switch 69 as shown in FIG. 3 of the drawings. The control unit 66 is also activated thereby entering into an initialize and self-test procedure. The pump unit 52 is also activated and operates at an initial flow rate A through both Path 1 and Path 2 as shown in FIGS. 3 and 4 of the drawings. FIG. 5 of the drawings illustrates a chart showing an exemplary flow rate of the pump unit 52 based upon the coolant temperature. If the temperature of the coolant is below Temperature X, the control valve 42 reduces the coolant flow through Path 2 of the coolant distribution system. If the temperature of the coolant is above Temperature X, the control valve 42 increases the coolant flow through Path 2 of the coolant distribution system to increase the cooling of the coolant by the external environment through the heat exchanger unit 40. The coolant heated by the heater unit 62 flows into the spray unit 30 thereby increasing the temperature of the electronic devices 12 and returns to the pump unit 52 through the attitude independent valves 50.

Figure 6:
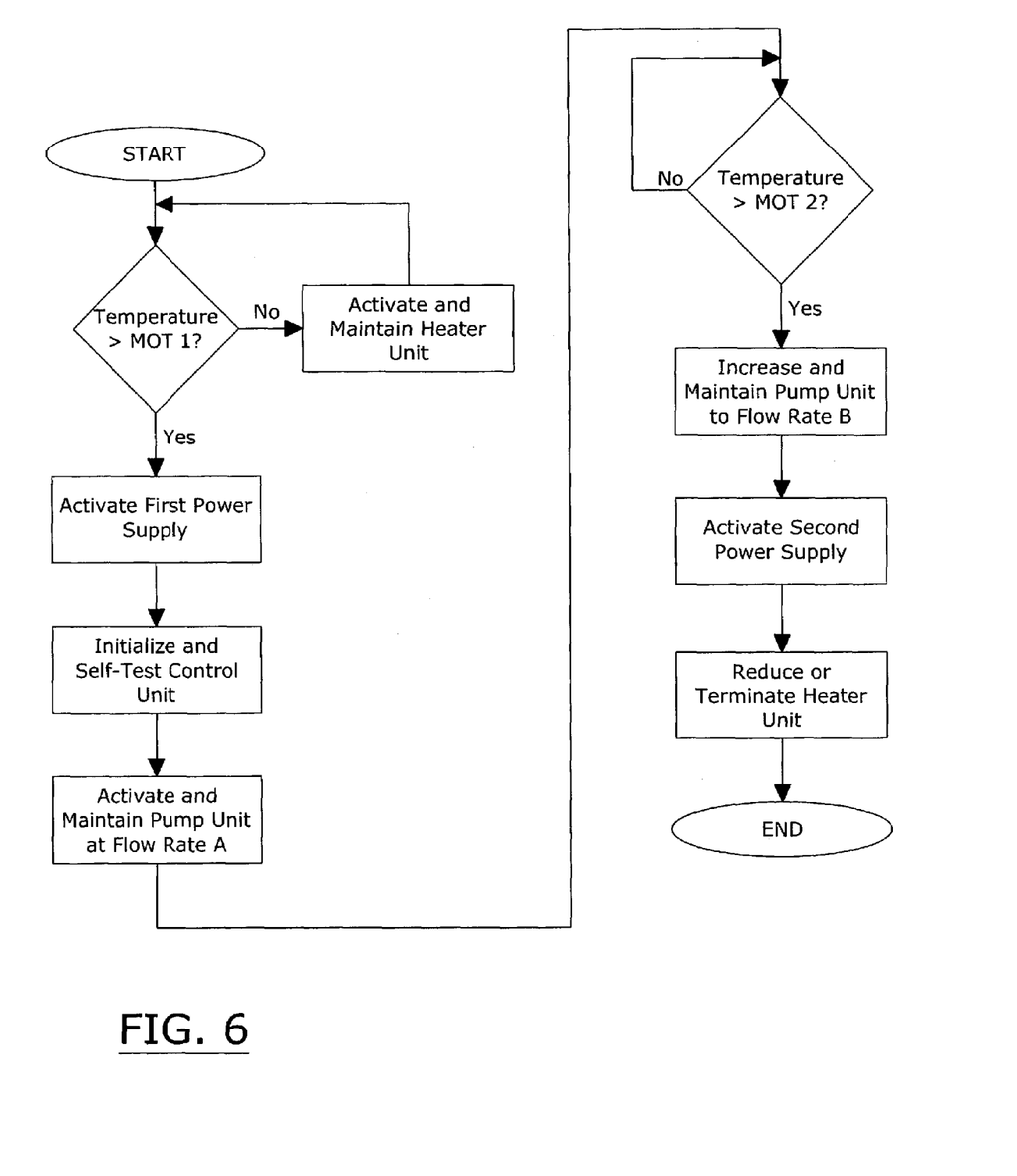
FIG. 6 is a flowchart illustrating an alternative embodiment of the activation and operation of the present invention.

When the temperature of the coolant increases above MOT 2, the coolant flow through the pump unit 52 is increased to flow rate B as shown in FIG. 3 of the drawings. In addition to increasing the flow rate of the pump unit 52, the second power supply 65 is thereafter activated thereby providing electrical power to the electronic devices 12 as further shown in FIG. 3 of the drawings. The coolant is thereafter heated by both the heater unit 62 and the electronic devices 12 during normal operation. If the temperature of the coolant is below Temperature X, the control valve 42 reduces the coolant flow through Path 2 of the coolant distribution system as shown in FIG. 4 of the drawings. If the temperature of the coolant is above Temperature X, the control valve 42 increases the coolant flow through Path 2 of the coolant distribution system to increase the cooling of the coolant by the external environment through the heat exchanger unit 40. If the coolant temperature exceeds the MOT 3, the heater unit 62 may either be terminated or reduced to decrease the heating of the coolant as shown in FIG. 3 of the drawings. Alternatively, the heater unit 62 may either be terminated or reduced to decrease the heating of the coolant immediately after the coolant temperature exceeds MOT 2 as shown in FIG. 6 of the drawings.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A spray cooling system for extreme environments, comprising:
   an enclosure;
   a spray unit within said enclosure;
   an independent chamber within said enclosure, wherein said independent chamber is fluidly connected to said spray unit;
   a heater unit within said independent chamber;
   a first power supply within said independent chamber;
   a control unit within said independent chamber; and
   a pump unit fluidly connected to said independent chamber for providing pressurized coolant to said enclosure, wherein said pump unit receives coolant from said spray unit.

2. The spray cooling system for extreme environments of claim 1, wherein said first power supply is positioned near said heater unit.

3. The spray cooling system for extreme environments of claim 1, wherein said first power supply is electrically connected to said control unit.

4. The spray cooling system for extreme environments of claim 1, wherein said heater unit is operated prior to operating said first pump unit, said control unit and said first power supply.

5. The spray cooling system for extreme environments of claim 1, including a heat exchanger unit fluidly connected to said spray unit, wherein said independent chamber is fluidly connected to said spray unit via a first path and to said heat exchanger unit via a second path.

6. The spray cooling system for extreme environments of claim 5, including a control valve fluidly connected between said heat exchanger unit, said spray unit and said independent chamber for controlling the flow of coolant through said first path and said second path.

7. A spray cooling system for extreme environments, comprising:
   an enclosure;
   a spray unit within said enclosure;
   a heat exchanger unit fluidly connected to said spray unit; and
   a pump unit including an inlet port and an outlet port, wherein said outlet port is fluidly connected to said spray unit via a first path and fluidly connected to said heat exchanger unit via a second path, wherein a return path between said spray unit and said pump unit provides returned coolant to said pump unit.

8. The spray cooling system for extreme environments of claim 7, including a control valve fluidly connected between said heat exchanger unit, said spray unit and said pump unit for controlling the flow of coolant through said first path and said second path.

9. The spray cooling system for extreme environments of claim 8, wherein said control valve increase coolant flow through said second path when the coolant temperature is greater than a first temperature.

10. The spray cooling system for extreme environments of claim 8, wherein said control valve reduces coolant flow through said second path Path 2 when the coolant temperature is less than a first temperature.

11. The spray cooling system for extreme environments of claim 10, including an independent chamber positioned within said enclosure, wherein said independent chamber is fluidly connected between said pump unit and said control valve.

12. The spray cooling system for extreme environments of claim 11, including a heater unit and a first power supply within said independent chamber.

13. The spray cooling system for extreme environments of claim 12, including a control unit within said independent chamber.

14. The spray cooling system for extreme environments of claim 13, wherein said first power supply is electrically connected to said control unit.

15. The spray cooling system for extreme environments of claim 12, wherein said first power supply is positioned near said heater unit.

16. The spray cooling system for extreme environments of claim 12, wherein said heater unit is operated prior to operating said first pump unit, said control unit and said first power supply.

17. A method of operating a spray cooling system having a spray unit for thermally managing one or more electronic devices, and a pump unit, said method comprising the steps of:
    activating a heater unit if a coolant temperature is less than a first temperature; and
    activating a first power supply, a control unit and said pump unit at a first flow rate if said coolant temperature is greater than a second temperature, wherein said second temperature is at least a minimum operating temperature of said pump unit.

18. The method of operating a spray cooling system of claim 17, including the step of increasing said pump unit to a second flow rate if said coolant temperature is greater than a third temperature.

19. The method of operating a spray cooling system of claim 17, including the step of activating a second power supply if said coolant temperature is greater than said third temperature, wherein said second power supply is electrically connected to at least one electronic device within said spray unit.

20. The method of operating a spray cooling system of claim 17, including an independent chamber fluidly connected between said spray unit and said pump unit, wherein said independent chamber encloses said heater unit, said first power supply and said control unit.

21. A method of operating a spray cooling system having a spray unit for thermally managing one or more electronic devices, a pump unit fluidly connected to said spray unit via a first path and a second path, and a heat exchanger unit fluidly positioned within said second path, said method comprising the steps of:
    activating a heater unit if a coolant temperature is less than a first temperature; and
    activating a first power supply, a control unit and said pump unit at a first flow rate if said coolant temperature is greater than said second temperature, wherein said second temperature is at least a minimum operating temperature of said pump unit.

22. The method of operating a spray cooling system of claim 21, including the step of reducing the flow rate of coolant through said second path if said coolant temperature is less than a third temperature.

23. The method of operating a spray cooling system of claim 21, including the step of increasing the flow rate of coolant through said second path if said coolant temperature is greater than a third temperature.

24. The method of operating a spray cooling system of claim 21, including the step of increasing said pump unit to a second flow rate if said coolant temperature is greater than a third temperature.

25. The method of operating a spray cooling system of claim 21, including the step of activating a second power supply if said coolant temperature is greater than a third temperature, wherein said second power supply is electrically connected to at least one electronic device within said spray unit.

26. The method of operating a spray cooling system of claim 21, including an independent chamber fluidly connected between said spray unit, said pump unit and said heat exchanger unit, and wherein said independent chamber encloses said heater unit, said first power supply and said control unit.

27. The method of operating a spray cooling system of claim 26, including a control valve fluidly positioned between said spray unit, said pump unit and said heat exchanger unit for controlling the coolant flow through said first path and said second path.

* * * * *